(12) United States Patent
Meng

(10) Patent No.: US 9,857,398 B2
(45) Date of Patent: Jan. 2, 2018

(54) INTER-CIRCUIT BOARD CONNECTOR WITH CURRENT SENSOR

(71) Applicant: Lenovo Enterprise Solutions (Singapore) PTE. LTD., New Tech Park (SG)

(72) Inventor: Jian Meng, Ottawa (CA)

(73) Assignee: Lenovo Enterprise Solutions (Singapore) PTE. LTD., New Tech Park (SG)

( * ) Notice: Subject to any disclaimer, the term of this patent is extended or adjusted under 35 U.S.C. 154(b) by 219 days.

(21) Appl. No.: 14/610,446

(22) Filed: Jan. 30, 2015

(65) Prior Publication Data

US 2016/0223596 A1    Aug. 4, 2016

(51) Int. Cl.
| | |
|---|---|
| *G01R 1/20* | (2006.01) |
| *G01R 19/00* | (2006.01) |
| *H01R 12/73* | (2011.01) |
| *H01R 13/66* | (2006.01) |
| *H01L 21/00* | (2006.01) |

(52) U.S. Cl.
CPC ......... *G01R 19/0092* (2013.01); *H01R 12/73* (2013.01); *H01R 13/6683* (2013.01); *H01L 21/00* (2013.01); *H01L 2221/00* (2013.01); *H04L 2201/00* (2013.01)

(58) Field of Classification Search
CPC ...... H01L 21/00; H01L 2221/00; H02M 1/00; H04L 1/00; H04L 2201/00
See application file for complete search history.

(56) References Cited

U.S. PATENT DOCUMENTS

| | | | | |
|---|---|---|---|---|
| 3,556,525 | A * | 1/1971 | Davis | A63F 7/0664 |
| | | | | 273/138.2 |
| 3,566,190 | A * | 2/1971 | Huebner | H01R 13/518 |
| | | | | 361/690 |
| 3,567,998 | A * | 3/1971 | Ammerman | H01R 12/721 |
| | | | | 361/752 |
| 3,582,774 | A | 6/1971 | Forgacs | |
| 4,378,525 | A | 3/1983 | Burdick | |
| 5,473,244 | A | 12/1995 | Libove et al. | |
| 5,602,723 | A * | 2/1997 | Takahashi | H05K 7/1422 |
| | | | | 257/659 |
| 6,175,230 | B1 * | 1/2001 | Hamblin | G01R 31/31915 |
| | | | | 324/73.1 |
| 6,426,617 | B1 * | 7/2002 | Haensgen | G01R 15/202 |
| | | | | 324/117 H |
| 8,058,876 | B2 | 11/2011 | Cernasov et al. | |
| 8,723,515 | B2 | 5/2014 | Motz et al. | |
| 2006/0219436 | A1 | 10/2006 | Taylor et al. | |
| 2007/0170533 | A1 | 7/2007 | Doogue et al. | |
| 2007/0279053 | A1 | 12/2007 | Taylor et al. | |
| 2008/0013298 | A1 | 1/2008 | Sharma et al. | |

(Continued)

*Primary Examiner* — Jermele M Hollington
*Assistant Examiner* — Temilade Rhodes-Vivour
(74) *Attorney, Agent, or Firm* — Jason Friday

(57) ABSTRACT

An inter-circuit board connector connects a first circuit board to a second circuit board. The inter-circuit board connector includes power pins to transmit power from the first circuit board to the second circuit board. Each power pin provides an equal amount of current from the first circuit board to the second circuit board. The inter-circuit board connector includes a current sensor to measure current on a selected number of the power pins that can be less than a total number of the power pins.

20 Claims, 6 Drawing Sheets

(56) References Cited

U.S. PATENT DOCUMENTS

2012/0074929 A1    3/2012  Wobschall
2013/0258624 A1*  10/2013  Hardin .................. H05K 1/184
                                                    361/773
2013/0265076 A1*  10/2013  Pan ........................ G01R 31/40
                                                    324/756.07
2014/0203803 A1    7/2014  Meng

* cited by examiner

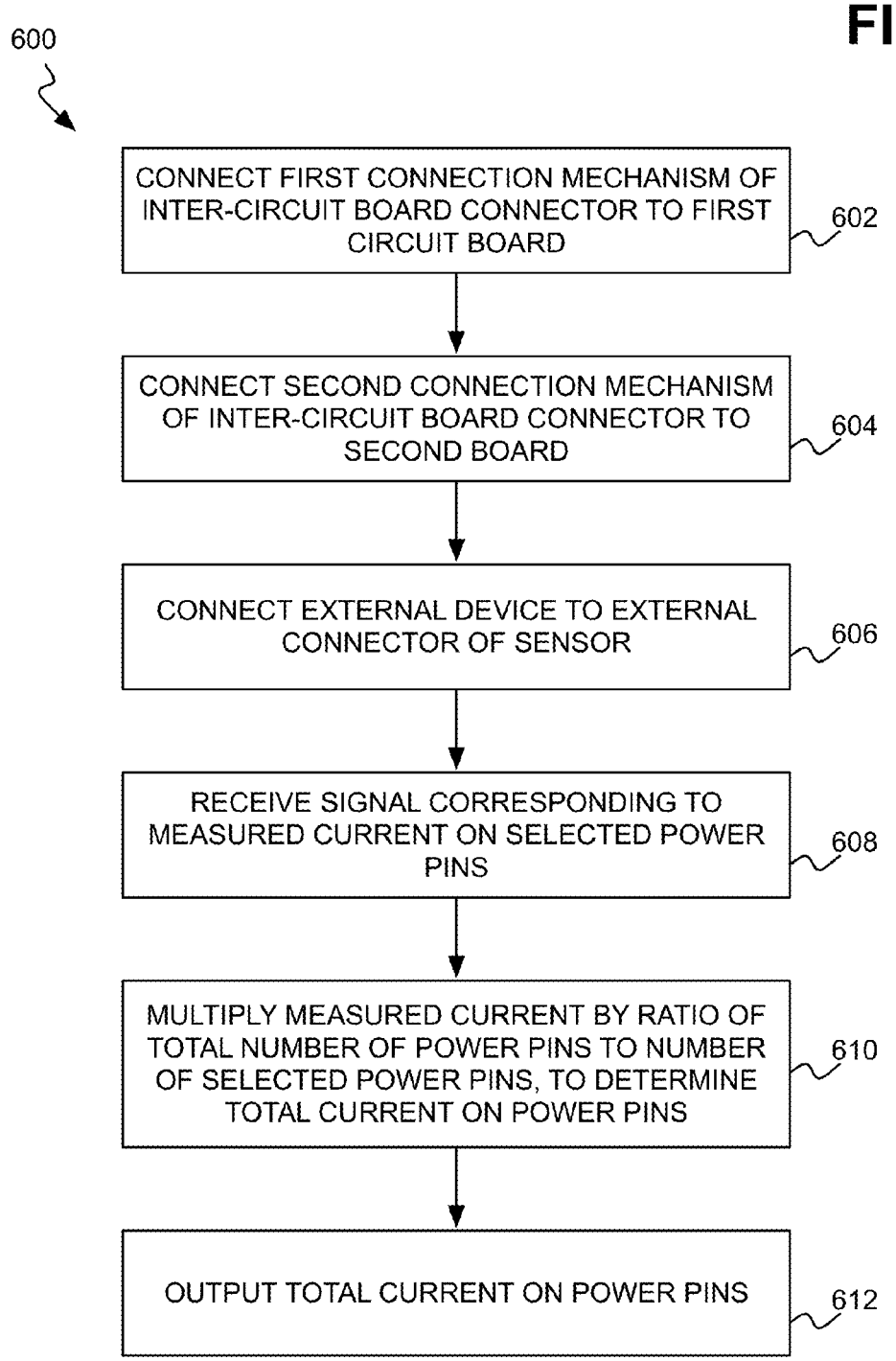

INTER-CIRCUIT BOARD CONNECTOR WITH CURRENT SENSOR

BACKGROUND

Circuit boards can be connected to other circuit boards. For example, motherboards, main boards, or backplane boards can be connected to daughter boards. The daughter boards are powered by power received from the circuit boards to which they are connected.

SUMMARY

An example inter-circuit board connector includes a first connection mechanism to connect to a first circuit board. The connector includes a second connection mechanism to connect to a second circuit board. The connector includes power pins extending from the first connection mechanism to the second connection mechanism to transmit power from the first circuit board to the second circuit board. Each power pin provides an equal amount of current from the first circuit board to the second circuit board. The connector includes a current sensor to measure current on a selected number of the power pins.

An example method includes receiving a signal corresponding to a current measured by a current sensor of an inter-circuit board connector connecting a first circuit board to a second circuit board. The connector includes power pins extending from the first circuit board to the second circuit board through the inter-circuit board connector. The method includes multiplying the current measured by the current sensor by a ratio of a total number of the power pins to a number of the power pins on which the current sensor measures the current, to calculate a total current transmitted on the power pins from the first circuit board to the second circuit board through the inter-circuit board connector. The method includes outputting the total current transmitted on the power pins from the first circuit board to the second circuit board through the inter-circuit board connector. The number of the power pins on which the current sensor measures the current is less than a total number of the power pins. Each power pin provides an equal amount of current from the first circuit board to the second circuit board.

An example electronic device includes a first circuit board providing power. The device includes an inter-circuit board connector connected to the first circuit board and receptive to connection to a second circuit board powered by the power of the first circuit board. The connector includes power pins to transmit the power from the first circuit board to the second circuit board. Each power pin provides an equal amount of current from the first circuit board to the second circuit board. The connector includes a current sensor to measure current on a selected number of the power pins.

BRIEF DESCRIPTION OF THE SEVERAL VIEWS OF THE DRAWINGS

The drawings referenced herein form a part of the specification. Features shown in the drawing illustrate only some embodiments of the disclosure, and not of all embodiments of the disclosure, unless the detailed description explicitly indicates otherwise, and readers of the specification should not make implications to the contrary.

FIG. 6 is a flowchart of an example method for determining the total current transmitted by a first circuit board to a second circuit board from the current measured by a current sensor of an inter-circuit board connector connecting the two circuit boards.

DETAILED DESCRIPTION

Figure 1:
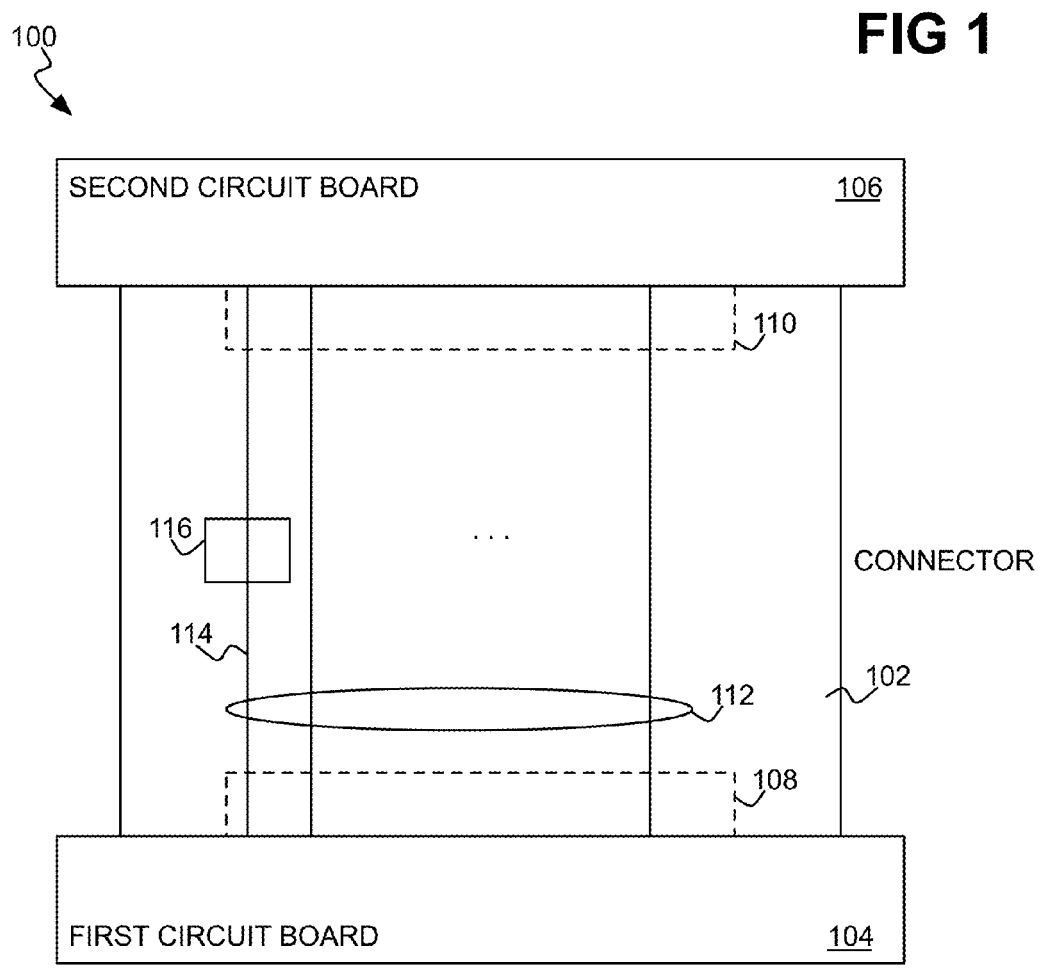
FIG. 1 is a block diagram of an electronic device including an example inter-circuit board connector having an integrated current sensor.

The following detailed description of exemplary embodiments of the disclosure refers to the accompanying drawings that form a part of the description. The drawings illustrate specific exemplary embodiments in which the disclosure may be practiced. The detailed description, including the drawings, describes these embodiments in sufficient detail to enable those skilled in the art to practice the disclosure. Those skilled in the art may further utilize other embodiments of the disclosure, and make logical, mechanical, and other changes without departing from the spirit or scope of the disclosure. Readers of the following detailed description should, therefore, not interpret the description in a limiting sense, and only the appended claims define the scope of the embodiment of the disclosure.

As noted in the background, circuit boards, like backplane boards, can be connected to other circuit boards, like daughter boards. A backplane board connected to a daughter board can provide power to the daughter board. The power provided to the daughter board can be of relatively high amperage current, such as ten amps or more. During testing and at other times, the current provided to the daughter board may have to be measured.

Existing approaches for sensing and measuring this current typically place some type of current detector in series with conductive traces on one of the boards. Such types of current detectors include multimeters, current sensor resistors, current probes, and current clamps. These conventional approaches can be problematic, however. Not all types of current detectors can measure current accurately at high amperage, which usually corresponds to low voltage. Furthermore, they require that a conductive trace be cut so that the current detector can be placed in series with the conductive trace. At best, this requires that the conductive trace be repaired afterwards. At worst, cutting the conductive trace may be impractical or even impossible.

Another approach is described in the patent application entitled "current detector to sense current without being in series with conductor," filed on Jan. 20, 2013, and assigned application Ser. No. 13/745,832. In this approach, a current detector is non-invasively integrated within a circuit board. This approach overcomes the problems associated with in-series current-sensing techniques, but does require that the circuit board be constructed to include the detector.

Disclosed herein are techniques to sense current flowing from a first circuit board to a second circuit board, without having to modify or specially construct either circuit board. Rather, the current sensor is integrated within an inter-circuit board connector, such as a backplane connector, by which the second circuit board is connected to the first circuit board. Furthermore, because power is provided over multiple pins of the connector from the first circuit board to the second circuit board, the integrated current sensor can measure the current flowing within in just a small number of these pins, while still permitting the total current flowing between the boards to be determined. This means that the current sensor can be smaller and generate less heat than if the total current were directly measured, which is particularly advantageous when the total current is high.

FIG. 1 shows an example electronic device 100 that includes an inter-circuit board connector 102 connecting a first circuit board 104 to a second circuit board 106. The first circuit board 104 may be a motherboard, a main board, a backplane board, and so on. The second circuit board 106 may be a daughter board. Each circuit board 104 and 106 typically includes electronic components, traces, and so on, to realize a functionality of the electronic device 100. The circuit boards 104 and 106 may also be referred to as logic boards.

The inter-circuit board connector 102 includes a first connection mechanism 108 by which the connector 102 is connected to the first circuit board 104. The connector 102 similarly includes a second connection mechanism 110 by which the connector 102 is connected to the second circuit board 106. The connector 102 includes power pins 112 through which the first circuit board 104 transmits power to the second circuit board 106 to power the second circuit board 106. Each power pin 112 provides an equal amount of current from the first circuit board 104 to the second circuit board 106. The connector 102 typically includes other types of pins as well, such as signal pins by which logic, data, and other types of such signals are communicated between the circuit boards 104 and 106, one or more ground pins to connect the second circuit board 106 to the ground of the first circuit board 104, and so on.

It is noted that the reference within the detailed description to various pins as power pins, ground pins, signal pins, and so on, of the connector 102 is made for illustrative purposes only, to distinguish between which pins provide power, which pins are connected to ground, which pins transmit signals, and so on. However, each such pin can in actuality be a general-purpose pin that effectively becomes a power pin, a ground pin, a signal pin, and so on, depending on how it is connected to the circuit boards 104 and 106. That is, there may be no physical difference between a power pin, a ground pin, a signal pin, and so on. A pin of the connector 102 is or becomes a power pin, for instance, in one implementation when it is connected to power on the circuit board 104 to transmit such power to the circuit board 106.

The inter-circuit board connector 102 includes a current sensor 116 that measures current on a selected power pin 114 of the power pins 112. In the example of FIG. 1, there is one selected power pin 114. The number of selected power pins 114 can be less than the total number of power pins 112. In another implementation, the number of selected power pins 114 can be equal to the total number of power pins 112. The remainder of the detailed description, however, is presented in relation to the implementation in which the number of selected power pins 114 is less than the total number of power pins 112

Because the current on each power pin 112 is equal, the total amount of current over all the power pins 112 can thus be determined from the amount of current on the selected power pins 114 that the current sensor 116 measures. Specifically, the total amount of current is equal to the current measured by the current sensor 116, multiplied by a ratio of the total number of power pins 112 to the number of selected power pins 114. In the case where the number of selected power pins 114 is equal to one, the total amount of current is thus equal to the current measured by the current sensor 116, multiplied by the total number of power pins 112.

The current sensor 106 can be itself be connected to power and ground to be able to measure the current on the selected power pins 114, and responsively provides a signal that corresponds to the measured current. In one implementation, the current sensor 106 is connected to the power and ground of a selected circuit board of the circuit boards 104 and 106, and similarly outputs the signal corresponding to the measured current on the selected power pins 114 to this selected circuit board. In another implementation, the current sensor 106 is externally connected to power and ground and externally outputs the measured current signal, as opposed to being connected to the power and ground of, and outputting the signal to, either circuit board 104 or board 106.

Figure 2:
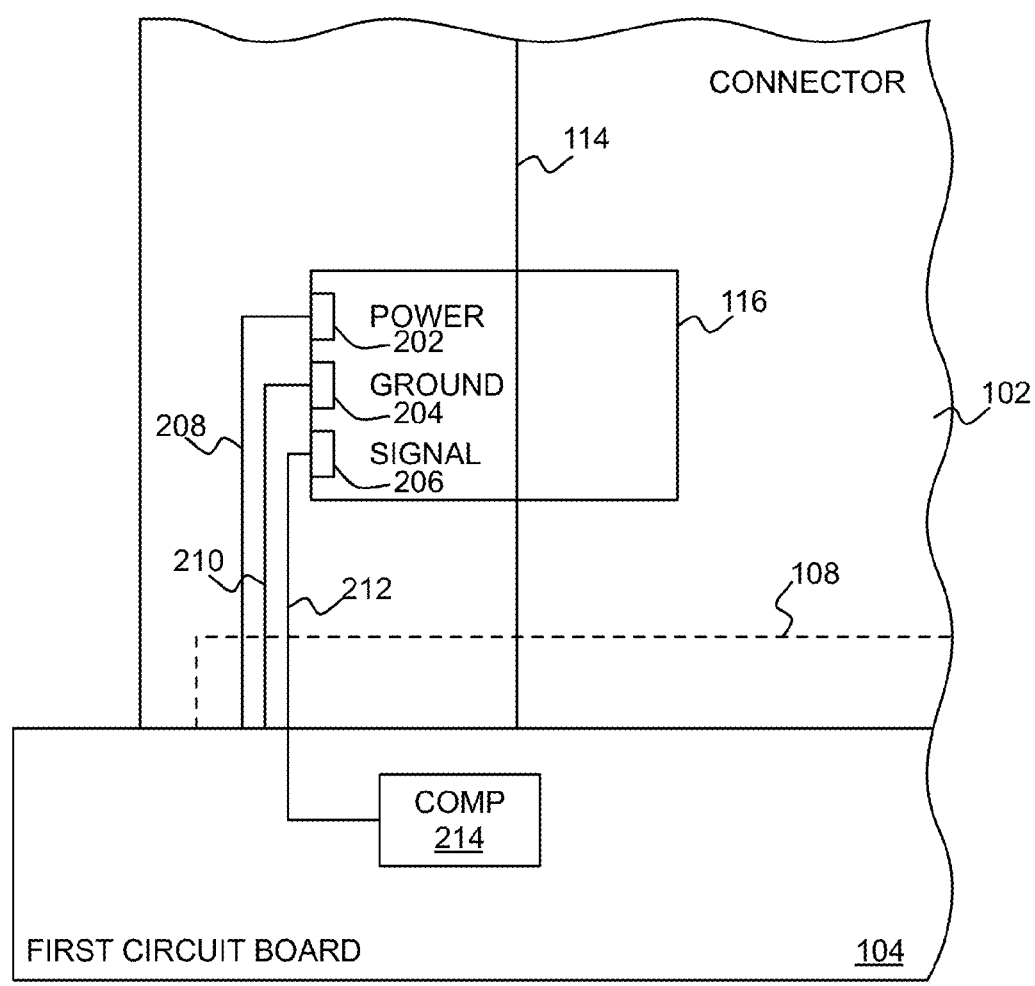
FIG. 2 is a block diagram of an example implementation by which a current sensor of an inter-circuit board connector is connected to power and ground and outputs a signal corresponding to a sensed current.

FIG. 2 shows an example of a portion of the inter-circuit board connector 102 and a portion of the first circuit board 104 in accordance with the former implementation. In the example of FIG. 2, the selected circuit board is thus the first circuit board 104; the first connection mechanism 108 that connects the connector 102 to the board 104 is considered a selected connection mechanism. (By comparison, if the second circuit board 106 were the selected circuit board instead of the first circuit board 104, the second connection mechanism 110 would be the selected connection mechanism.) The current sensor 116 measuring the current on the selected power pin 114 includes a power input 202, a ground input 204, and a signal output 206. The inputs 202 and 204 and the output 206 are connected to the first circuit board 104 via a power pin 208, a ground pin 210, and a signal pin 212, respectively.

The current sensor 116 thus receives power on the power input 202, where the first circuit board 104 provides power on the power pin 208 extending from the power input 202 to the connection mechanism 108. It is noted that the power pin 208 is an additional power pin, and is not one of the power pins 112 connecting the first circuit board 104 to the second circuit board 106. The current on the power pin 208 may be less than the current on each power pin 112. The current sensor 116 connects to the ground of the first circuit board 104 via the ground pin 210 extending from the ground input 204 to the connection mechanism 108. The current sensor 116 provides the measured current signal to the first circuit board via the signal pin 212 extending from the signal output 206 to the connection mechanism 108. It is noted that the pins 208, 210, and 212 may extend to just the selected connection mechanism (i.e., the connection mechanism 108 in the example of FIG. 2).

The first circuit board 104 can include an electronic component 214, such as an integrated circuit (IC), which receives the signal corresponding to the measured current on the selected power pin 114. The component 214 may multiply the measured current on the selected power pin 114 by the ratio of the total number of power pins 112 to the number of selected power pins 114 to calculate the total current over the power pins 112. The component 214 can then output this determined total current.

Figure 3:
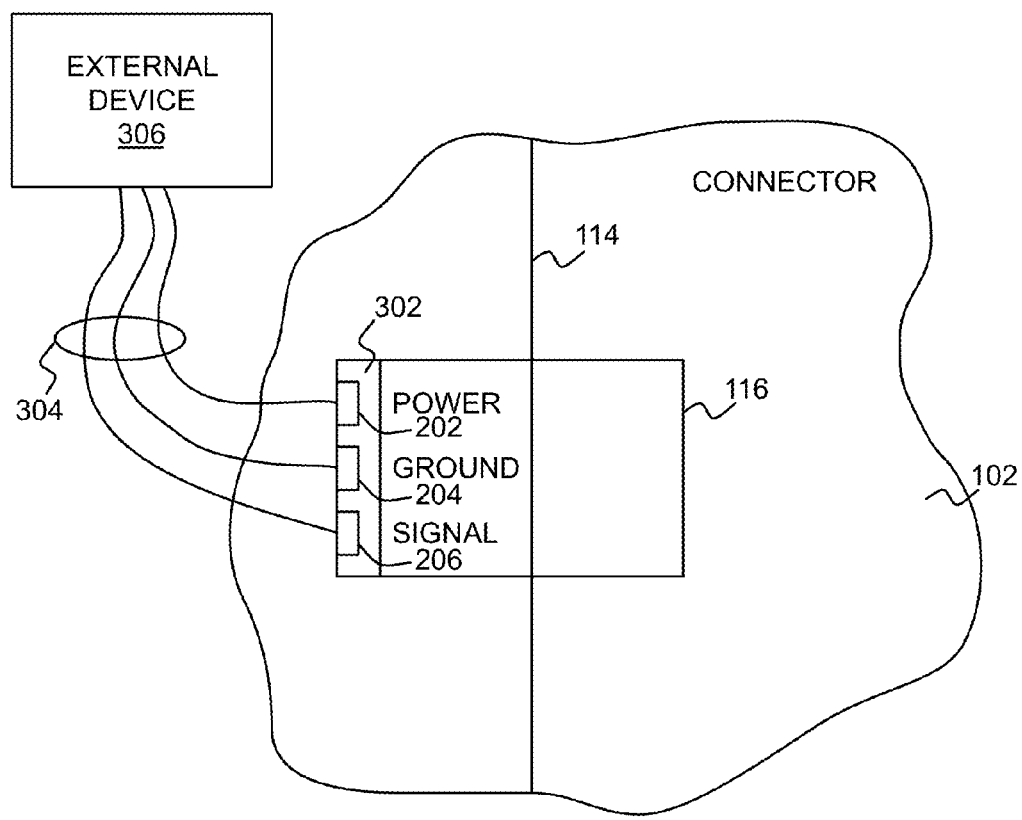
FIG. 3 is a block diagram of an example implementation by which a current sensor of an inter-circuit board connector is connected to power and ground and outputs a signal corresponding to a sensed current.

FIG. 3 shows an example of a portion of the inter-circuit board connector 102 in accordance with another implementation in which the current sensor 106 is externally connected to power and ground and externally outputs the measured current signal. In the example of FIG. 3, the current sensor again includes the power input 202, the ground input 204, and the signal output 206. The inputs 202 and 204 and the output 206 are part of an external connector 302 of the inter-circuit board connector 102. A cable 304 is connected to the external connector 302 and to an external device 306. The external device 306 may be a standalone device, such as a multi-meter that has an appropriate input to receive the measured current signal.

The first circuit board 104 and the second circuit board 106 are not part of the external device 306. The device 306 provides power and ground to the current sensor 116 over the cable 304 connected to the external connector 302 that includes the power input 202 and the ground input 204. The device 306 receives the signal corresponding to the measured current on the selected power pin 114 from the current sensor 116 over the cable 304 connected to the external connector 302 that includes the signal output 206. The device 306 multiplies the measured current on the power pin 114 by the ratio of the total number of power pins 112 to the number of selected power pins 114 to calculate the total current over the power pins 112. The device 306 then outputs this determined total current.

Figure 4:
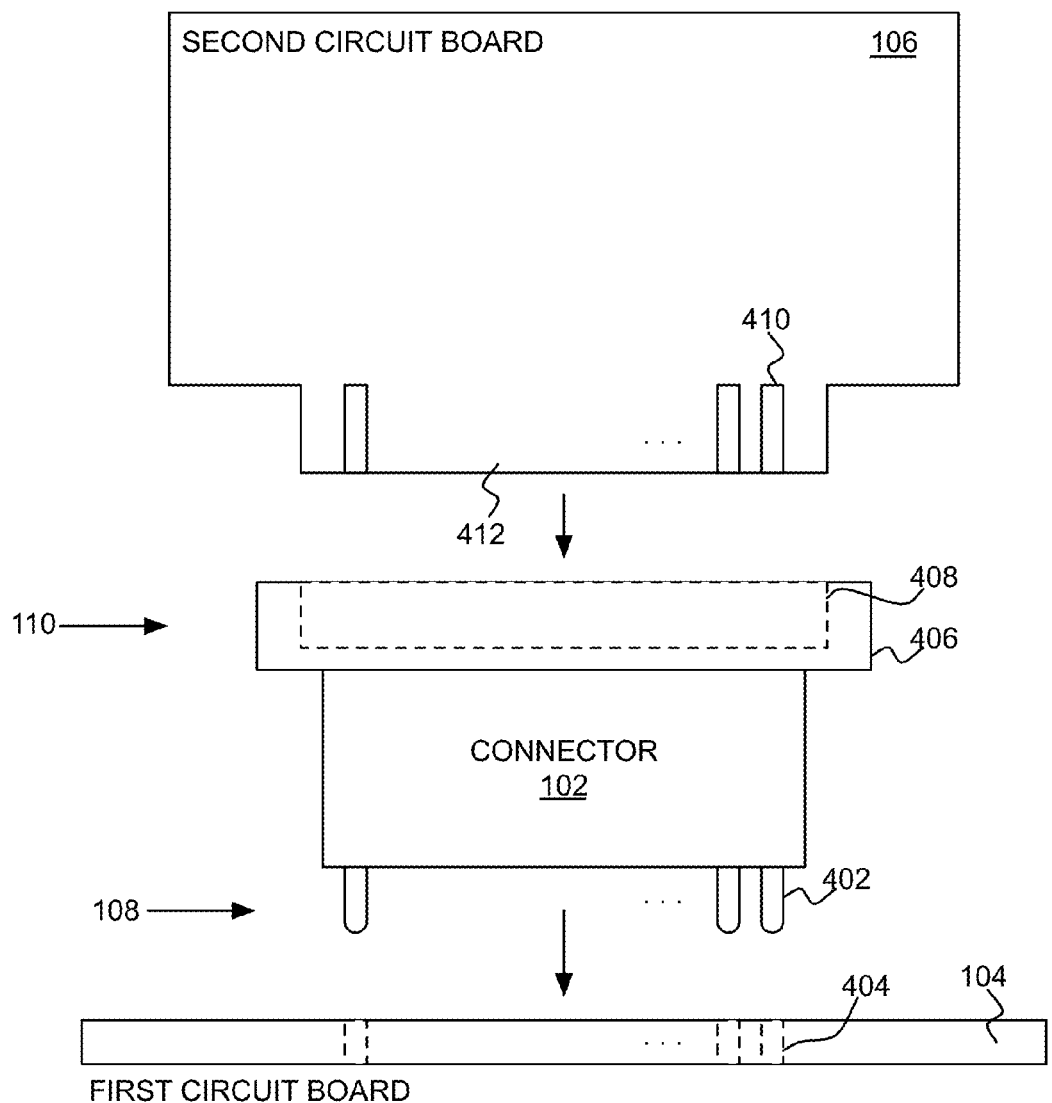
FIG. 4 is a diagram of an example implementation of a form factor of an inter-circuit board connector.

FIG. 4 shows an example implementation of the form factor of the inter-circuit board connector 102. The first connection mechanism 108 is implemented as a number of physical connection pins 402. The connection pins 402 are insertable into and through corresponding vias 404 of the first circuit board 104, the thickness of which is depicted in FIG. 4. After the connections pins 402 have been inserted into and through the vias 404, solder can be applied to permanently affix the inter-circuit board connector 102 to the first circuit board 104. The physical connection pins 402 connect to the power pins 112, and can also connect to the pins 208, 210, and 212.

The second connection mechanism 110 of the inter-circuit board connector 102 is implemented as a socket 406 having a slot 408. A corresponding portion 412 of the second circuit board 106 is removably inserted into the slot 408. Conductive traces 410 make electrical connection with the connector 102 inside the slot 408. The second circuit board 106 can thus be removed from the connector 102 in the example of FIG. 4. The conductive traces 410 connect to the power pins 112, and can also connect to the pins 208, 210, and 212.

Figure 5:
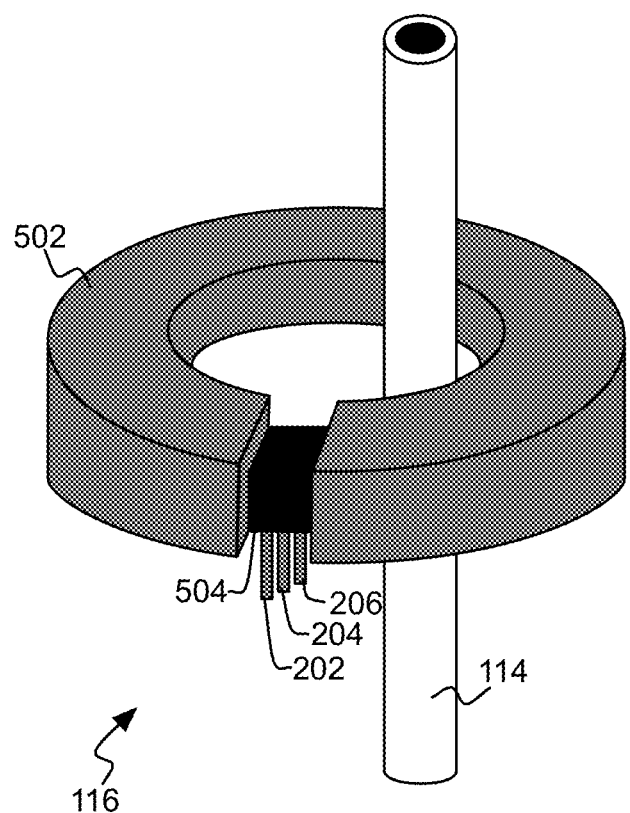
FIG. 5 is a diagram of example implementation of a current sensor of an inter-circuit board connector.

FIG. 5 shows an example implementation of the current sensor 116 of the inter-board circuit board connector 102 that measures the current on the selected power pin 114. The current sensor 116 includes a ferrite core 502 concentrically surrounding the selected power pin 114, and a Hall effect sensor 504 from which the power input 202, the ground input 204, and the signal output 206 extend. This implementation thus leverages the Hall effect, which is the production of a voltage difference across an electrical conductor, transverse to current in the conductor and a magnetic field perpendicular to the current. As such, the current sensor 116 of the example of FIG. 4 senses the current through the selected power pin 114 non-invasively, without having to be in place in series with the selected power pin 114.

FIG. 6 shows an example method 600 for using the inter-board circuit connector 102 to determine the total current transmitted by the first circuit board 104 to the second circuit board 106 over the connector 102. The first connection mechanism 108 of the connector 102 is connected to the first circuit board 104. Likewise, the second connection mechanism 110 of the connector 102 is connected to the second circuit board 106. If the current sensor 116 of the connector 102 includes the external connector 302, the external device 306 may be connected to the sensor 106 via the cable 304 being connected to the external connector 302.

Once the current sensor 116 measures the current on the selected power pins 114, the selected circuit board (i.e., one of the circuit boards 104 and 106) or the external device 306 receives a signal corresponding to this measured current (608). The electronic component 214 of the selected circuit board or the external device 306 multiplies the measured current by the ratio of the total number of power pins 112 to the number of selected power pins 114 to determine the total current on the power pins 112 (610). The electronic component 214 of the external device 306 then outputs this total current, which is the current that the first circuit board 104 transmits through the inter-circuit board connector 102 to the second circuit board 106 (612). For instance, the total current may be displayed, and so on.

The inter-circuit board connector 102 that has been described herein can thus be employed to sense and measure the current that the first circuit board 104 transmits to the second circuit board 104 through the connector 102. It is further noted that, although specific embodiments have been illustrated and described herein, it will be appreciated by those of ordinary skill in the art that any arrangement calculated to achieve the same purpose may be substituted for the specific embodiments shown. This application is thus intended to cover any adaptations or variations of embodiments of the present invention. As such and therefore, it is manifestly intended that this invention be limited only by the claims and equivalents thereof.

I claim:

1. An inter-circuit board connector assembly comprising:
   an inter-circuit board connector substrate;
   a first connection mechanism disposed on the inter-circuit board connector substrate to removably connect to a first circuit board via one of the first connection mechanism removably insertable into the first circuit board and the first circuit board removably insertable into the first connection mechanism, the first circuit board not part of the inter-circuit board connector and separate from the inter-circuit board connector substrate;
   a second connection mechanism disposed on the inter-circuit board connector substrate to removably connect to a second circuit board via one of the second connection mechanism removably insertable into the second circuit board and the second circuit board removably insertable into the second connection mechanism, the second circuit board not part of the inter-circuit board connector and separate from the inter-circuit board connector substrate;
   a plurality of power pins extending from the first connection mechanism to the second connection mechanism to transmit power from the first circuit board to the second circuit board, each power pin providing an equal amount of current from the first circuit board to the second circuit board; and
   a current sensor to measure current on a selected number of the power pins.

2. The inter-circuit board connector assembly of claim 1, wherein the current sensor comprises:
   a power input to receive power to power the current sensor;
   a ground input to connect the current sensor to ground; and
   one or more signal outputs on which the current sensor provides a signal corresponding to the current measured on the selected number of the power pins.

3. The inter-circuit board connector assembly of claim 2, further comprising:
one or more signal pins connected to the one or more signal outputs and extending to just a selected connection mechanism of the first connection mechanism and the second connection mechanism,
wherein where the selected connection mechanism is the first connection mechanism, the first circuit board is a selected circuit board,
wherein where the selected connection mechanism is the second connection mechanism, the second circuit board is the selected circuit board,
wherein the selected circuit board receives the signal provided by the current sensor via the one or more signal pins.

4. The inter-circuit board connector assembly of claim 3, further comprising:
an additional power pin connected to the power input and extending to just the selected connection mechanism, by which the selected circuit board provides power to the current sensor; and
a ground pin connected to the ground input and extending to the selected connection mechanism, by which the selected circuit board connects the current sensor to ground.

5. The inter-circuit board connector assembly of claim 2, wherein the current sensor further comprises:
an external connector including the power input, the ground input, and the one or more signal outputs to connect to a device that provides power and ground to the current sensor, that receives the signal provided by the current sensor, and that calculates a total current transmitted on the power pins from the output,
wherein the first circuit board and the second circuit board are not part of the device.

6. The inter-circuit board connector assembly of claim 1, wherein the current sensor is a Hall effect sensor that non-invasively measures the current on the selected number of the power pins without having to be electrically in series with the selected number of the power pins.

7. The inter-circuit board connector assembly of claim 1, wherein a total current transmitted on the power pins is equal to the current measured by the current sensor multiplied by a ratio of a total number of the power pins to the selected number of the power pins.

8. The inter-circuit board connector assembly of claim 1, wherein the selected number of the power pins is less than a total number of the power pins.

9. The inter-circuit board connector assembly of claim 1, wherein the first connection mechanism comprises a plurality of connection pins insertable into corresponding vias of the first circuit board for soldering to the first circuit board.

10. The inter-circuit board connector assembly of claim 1, wherein the second connection mechanism comprises a socket to which a corresponding part of the second circuit board is removably insertable.

11. A method comprising:
receiving a signal corresponding to a current measured by a current sensor of a inter-circuit board connector removably connecting a second circuit board to a first circuit board via a substrate of the inter-circuit board connector having a first connection mechanism and a second connection mechanism disposed thereon in which the first connection mechanism is removably connected to the first circuit board and the second connection mechanism is removably connected to the second circuit board, a plurality of power pins extending from the first circuit board to the second circuit board through the inter-circuit board connector, both the first circuit board and the second circuit board not part of the inter-circuit board connector and separate from the substrate;
multiplying the current measured by the current sensor by a ratio of a total number of the power pins to a number of the power pins on which the current sensor measures the current, to calculate a total current transmitted on the power pins from the first circuit board to the second circuit board through the inter-circuit board connector; and
outputting the total current transmitted on the power pins from the first circuit board to the second circuit board through the inter-circuit board connector,
wherein the number of the power pins on which the current sensor measures the current is less than a total number of the power pins,
wherein each power pin provides an equal amount of current from the first circuit board to the second circuit board,
wherein the first connection mechanism is removably connected to the first circuit board via one of the first connection mechanism being removably inserted into the first circuit board and the first circuit board removably inserted into the first connection mechanism,
and wherein the second connection mechanism is removably connected to the second circuit board via one of the second connection mechanism being removably inserted into the second circuit board and the second circuit board removably inserted into the second connection mechanism.

12. The method of claim 11, wherein the signal is transmitted by the current sensor on a signal pin of the inter-circuit board connector connected to a selected circuit board of the first circuit board and the second circuit board,
and wherein the signal is received at the selected circuit board.

13. The method of claim 12, wherein the current measured by the current sensor is multiplied by the ratio by an electronic component connected to the selected circuit board,
and wherein the total current transmitted on the power pins is output by the electronic component.

14. The method of claim 11, wherein the signal is transmitted by the current sensor on one or more signal inputs of an external connector of the current sensor to which a device is connected,
wherein the signal is received at the device,
and wherein the first circuit board and the second circuit board are not part of the device.

15. The method of claim 14, wherein the current measured by the current sensor is multiplied by the ratio by the device,
and wherein the total current transmitted on the power pins is output by the device.

16. The method of claim 15, further comprising:
connecting the device to the external connector of the current sensor.

17. The method of claim 11, wherein the number of the power pins on which the current sensor measures the current is equal to one, such that the ratio is equal to the total number of the power pins.

18. The method of claim 11, further comprising:
connecting a first connection mechanism of the inter-circuit board connector to the first circuit board; and
connecting a second connection mechanism of the inter-circuit board connector to the second circuit board.

19. An electronic device comprising:
a first circuit board providing power; and
an inter-circuit board connector assembly removably connected to the first circuit board, the inter-circuit board connector assembly comprising:
  a substrate;
  a first connection mechanism disposed on the substrate and removably connected to the first circuit board via one of the first connection mechanism removably inserted into the first circuit board and the first circuit board removably insertable into the first connection mechanism;
  a second connection mechanism disposed on the substrate and receptive to removable connection to a second circuit board via one of the second connection mechanism removably insertable into the second circuit board and the second circuit board removably inserted into the second connection mechanism, the second circuit board powered by the power of the first circuit board, both the first circuit board and the second circuit board not part of the inter-circuit board connector and separate from the substrate;
  a plurality of power pins to transmit the power from the first circuit board to the second circuit board, each power pin providing an equal amount of current from the first circuit board to the second circuit board; and
  a current sensor to measure current on a selected number of the power pins.

20. The electronic device of claim 19, further comprising the second circuit board.

* * * * *